United States Patent [19]

Anazawa et al.

[11] E Re. 29,218

[45] Reissued May 10, 1977

[54] PACKAGED SEMICONDUCTOR DEVICE FOR MICROWAVE USE

[75] Inventors: Shinzo Anazawa; Seiichi Ueno; Isamu Nagasako; Shigeru Sando, all of Tokyo, Japan

[73] Assignee: Nippon Electric Company, Limited Tokyo, Japan

[22] Filed: Oct. 4, 1976

[21] Appl. No.: 729,286

Related U.S. Patent Documents

Reissue of:

[64] Patent No.: 3,908,186
Issued: Sept. 23, 1975
Appl. No.: 481,458
Filed: June 20, 1974

[30] Foreign Application Priority Data

June 22, 1973 Japan ..... 48-69729

[52] U.S. Cl. ..... 357/80; 357/68

[51] Int. Cl.[2] ..... H01L 23/48; H01L 39/02

[58] Field of Search ..... 357/74, 68, 80

[56] References Cited

UNITED STATES PATENTS

| | | | |
|---|---|---|---|
| 3,374,533 | 3/1968 | Burks et al. | 357/80 |
| 3,483,308 | 12/1969 | Wakely | 357/80 |

*Primary Examiner*—Edward J. Wojciechowicz
*Attorney, Agent, or Firm*—Hopgood, Calimafde, Kalil, Blaustein & Lieberman

[57] ABSTRACT

A packaged semiconductor device for use at ultra-high frequencies is characterized by improved high frequency characteristics as a result of reduced stay capacitance and reduced energy loss. The device includes a dielectric substrate and at least two conductor layers each of which is integral and extends over the top, side, and bottom surfaces of the dielectric substrate. No part of the conductor layer on the top surface overlaps the part on the bottom surface when viewed in a direction normal to the substrate.

6 Claims, 9 Drawing Figures

PACKAGED SEMICONDUCTOR DEVICE FOR MICROWAVE USE

Matter enclosed in heavy brackets [ ] appears in the original patent but forms no part of this reissue specification; matter printed in italics indicates the additions made by reissue.

This invention relates generally to microwave semiconductor devices and, more particularly, to an improved housing structure for a microwave semiconductor device.

Generally, the performance and reliability of a semiconductor device depend directly on the construction and the material of the housing for the semiconductor element. Particularly, in and above the microwave frequency region, the undesirable parasitic reactances due to the inductance components of bonding wires and metallization layers, and the stray capacitances between metallization layers both adversely affect the frequency characteristics of the semiconductor device.

Furthermore, the increasing demand for increased miniaturization and high precision for semiconductor devices places severe restriction on the design of housing structures and the material selection for semiconductor elements, making it difficult to ensure reliability.

In conventional microwave semiconductor devices, flat housing structures having strip-line-type lead wires have been used, with a view to miniaturizing the housing and decreasing the parasitic reactance, which can be reduced also by the choice of a suitable dielectric material.

To reduce high-frequency losses and improve reliability, ceramic sealing construction is in general use. However, it is extremely difficult with a ceramic housing structure to achieve the matching between the desired and actual characteristic impedances. Also, various restrictions involved in manufacturing process makes it difficult to ensure reliability. Various attempts have been made to improve the reliability and frequency characteristics of semiconductor elements by miniaturizing the semiconductor housing structure and by selecting low-dielectric loss materials. However, none of these structures has been reported to be successful.

Accordingly, it is an object of the present invention to provide a novel semiconductor housing structure that contributes significantly to a reduction in the stray capacitance.

It is another object of the present invention to provide a semiconductor device having greatly improved frequency characteristics.

It is still another object of the present invention to provide a miniaturized semiconductor device of the type described having greater reliability than the presently known semiconductor devices.

According to the present invention, there is provided a packaged semiconductor device for use in the microwave region which comprises a dielectric plate or substrate having two substantially parallel top and bottom surfaces and a side surface, and at least two conductor layers of predetermined patterns. Each of the conductor layers has a first part formed on the top surface of the dielectric plate, a second part formed on the side surface, and a third part formed on the bottom surface, respectively, the first, second and third parts being in the form of an integrated single piece of conductor. A semiconductor element is mounted on the first part of one of the conductor layers and lead wires connect the electrodes of the semiconductor element to the first parts of the conductor layers. At least two lead-out wires are attached respectively to the third parts of the conductor layers. The packaged semiconductor device of the invention is characterized in that none of the first parts of the conductor layers overlie the third part of the other conductor layers when viewed in a direction normal to the dielectric plate.

As will be apparent from the following description, the first part of a particular one of the conductor layers never comes in a face-to-face relationship with the third parts of the other conductor layers with the dielectric plate lying therebetween. The stray capacitance of the device is, therefore, minimized, and the high-frequency characteristics are improved accordingly.

The above and further objects, features and advantages of the present invention will become more apparent from the following detailed description of embodiments taken in conjunction with the accompanying drawings, wherein:

FIG. 1 is a cross-sectional view of a conventional semiconductor device for use in an ultra high frequency region;

FIGS. 2 (a) and (b) are a schematic plan view and a cross-sectional view of another conventional semiconductor device, respectively;

Figure 5A:
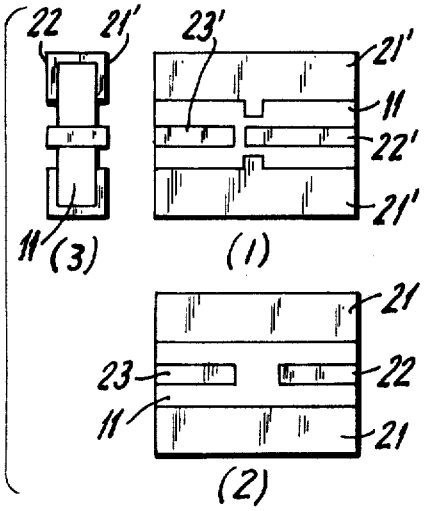
Figure 5B:
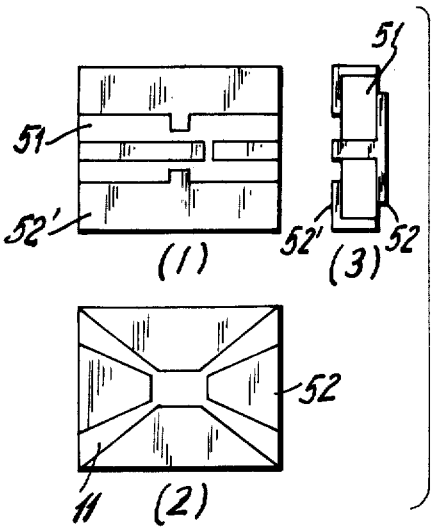
Figure 7:
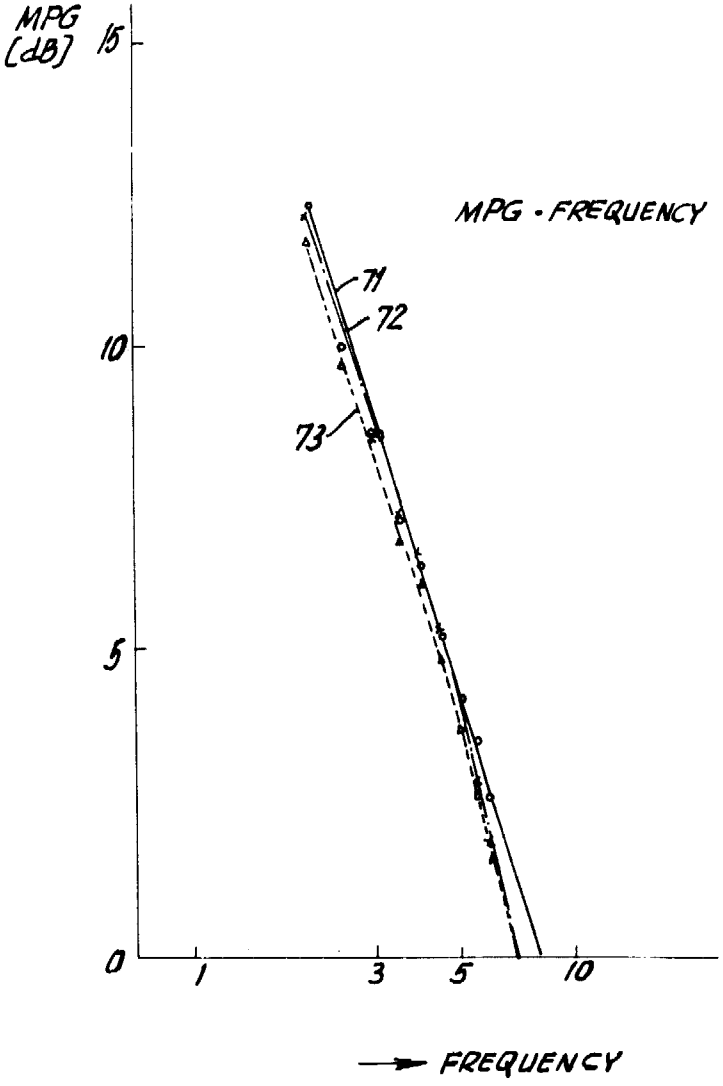
Figure 6:
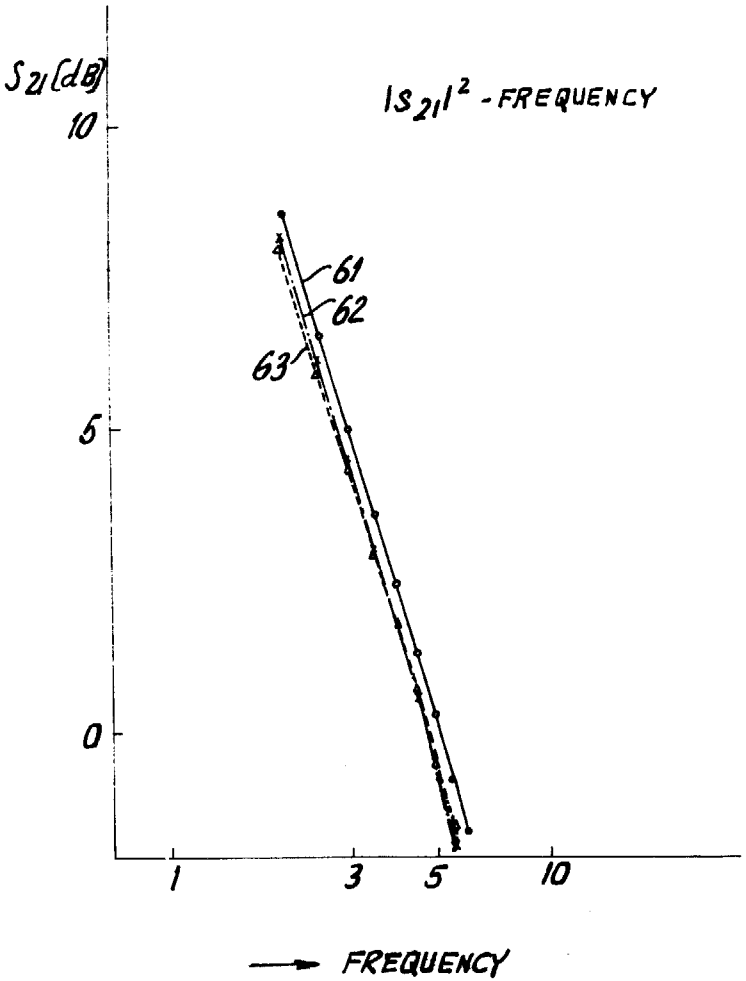

FIGS. 5 (a) (1), (2), and (3) illustrate patterned conductor layers or metallized portions formed on a dielectric substrate according to the preferred embodiment of this invention as viewed from the top, bottom, and side surfaces of the dielectric plate, respectively;

FIGS. 5 (b) (1), (2), and (3) show similar views of unfavorable examples of the patterns of the conductor layers; and FIGS. 6 and 7 are graphs illustrating a comparison between the characteristics of the preferred embodiment of this invention and a conventional semiconductor device, the former being the frequency dependence of $|S_{21}|^2$ and the latter the frequency dependence of maximum power gain.

Figure 1:
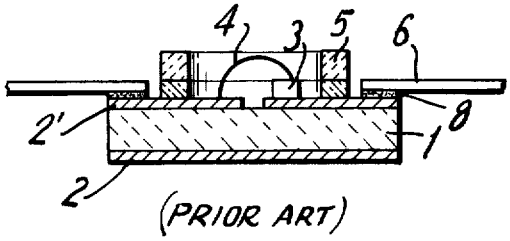
Figure 2A:
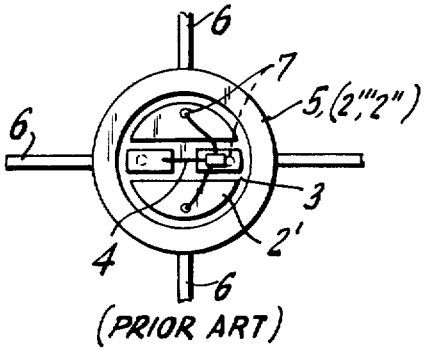
Figure 2B:
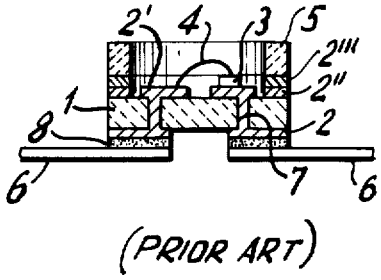

A typical conventional semiconductor housing structure for a microwave semiconductor device is the strip-line lead structure shown in FIG. 1, and another typical example of such a structure is the through-hole lead structure as shown in FIG. 2. Referring to FIG. 1, the strip-line lead structure has a dielectric substrate 1, such as a ceramic plate, whose bottom surface is metallized to form a conductor layer 2, while the top surface is metallized to form other conductor layers 2′ having of desired configurations. A conductor element 3 is mounted on a predetermined one of the conductor layers 2′, and wires 4 are bonded to the electrodes of the semiconductor element 3 and to the other conductor layers 2′. A wall member 5 of an insulative material is rigidly glass-sealed to the conductor layer 2′ and to the dielectric substrate 1. Lead-out wires 6 are attached to the conductive layers 2′ by using a brazing material 8, such as solder.

In this conventional package, the semiconductor element 3, wires 4, wall member 5, and lead-out wires 6 are substantially in a coplanar arrangement. Therefore, the package as a whole is difficult to miniaturize and simplify. Consequently, it becomes extremely difficult to match the impedances of the various parts of the housing with the desired characteristic impedance. Also, the parasitic reactance tends to increase. Furthermore, the unavoidable insufficient miniaturization of the package results in a fairly large space occupied by the semiconductor device, making it difficult to avoid undesirable effects on the circuit elements surrounding the device.

An improvement over the structure of FIG. 1 has been attempted by the structure shown in FIGS. 2 (a) and (b), which is aimed at minimizing the parasitic reactance by miniaturizing the housing structure. This construction is featured by through holes 7 formed in the dielectric substrate 1. The holes 7 are filled with a conductive material so as to interconnect conductive layers 2 and 2', which may be metallized portions formed on the bottom and top surfaces of the substrate 1 for attaching the lead-out wires thereto and for mounting the semiconductor element 3 thereon, respectively. The side wall member 5 is then brazed to the layer 2'' by means of brazing material 8 to hermetically seal the semiconductor element 3.

As will be apparent from the comparison between FIGS. 1 and 2, the construction FIG. 2 reduces the geometrical size of the device as a whole, thereby decreasing the area occupied in an equipment where the device is to be used. However, the undesirable reflection of high-frequency energy is caused at the bent portions of the layers 2 and 2' lying in the regions from the semiconductor element 3 and the lead-out wires 6 such that the equivalent resistance is increased, resulting in an increase in energy loss. Furthermore, the brazing by the use of brazing material 8 to provide a reliable hermetic seal, highly reliable heat-withstanding properly and mechanical strength, requires a metallized ring-shaped layer 2'' to be provided at the peripheral portion of the dielectric substrate 1, with another metallized ring-shaped layer 2''' disposed at the bottom end of the side wall member 5. The mutual induction between metallized ring-shaped layers 2'' and 2''' further deteriorates the performance of the device in the microwave region.

Figure 3:
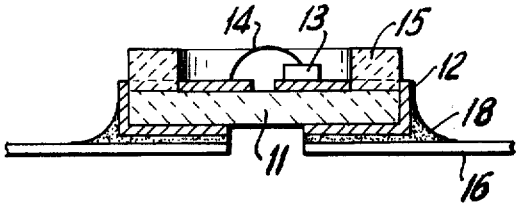
FIG. 3 is a cross-sectional view of a semiconductor device structure according to a preferred embodiment of this invention.
Figure 4:
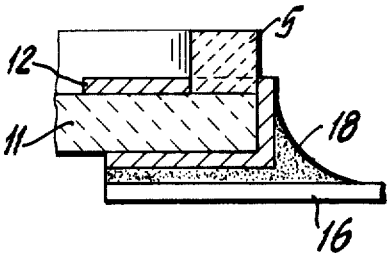
FIG. 4 is an enlarged view of a part of the construction shown in FIG. 3.

Referring to FIGS. 3 and 4, the embodiment of the present invention shown therein has a dielectric substrate 11 having top, side, and bottom surfaces covered with a conductive metallization layer 12 having predetermined conductive patterns. The conductor layer 12 is formed in such a manner that its portions lying on the top surface of the substrate should never be in an overlapped relationship with those portions lying on the bottom surface when viewed in a direction normal to the substrate. A wall member 15 made, for example, of laminated ceramics is bonded to the top surface of the dielectric substrate 11.

In this package structure, the semiconductor element 13 and the lead-out wires 16 are attached to those parts of the conductor layer 12 which are at the top and bottom surfaces of the dielectric substrate 11. This makes a great contribution to the miniaturization of the housing. Referring particularly to FIG. 4, which shows a part of the housing structure of FIG. 3, the lead-out wire 16 is brazed to the peripheral portion of the dielectric substrate 11. As will be seen in the structure, the portion of the conductor layers which has any possibility of causing the mismatching of the characteristic impedance is restricted to the peripheral portion of the housing. This is in clear contrast to the conventional housing structure shown in FIG. 2, where the mismatching of the impedance tends to be caused at the 90° bent portions of the conductor layers lying at both ends of each of the through holes. Furthermore, the angle formed between the conductor layer 12 on the side surface of the dielectric substrate 11 and the lead-out wire 16 is made larger than 90° by the brazing material 18 thereby decreasing the reflection of the microwave energy travelling therethrough. As compared with the package structure of FIG. 2, this helps reduce the microwave energy reflection at the bent portions of the signal path.

Another feature of this construction is that the non-overlapped relationship of the conductor layer 12 makes a great contribution to the reduction in the undesirable stray capacitance. The effect of reducing the stray capacitance and the microwave energy reflection is enhanced particularly when none of the conductor layer sections 21', 22', and 23' and 21, 22, and 23 (FIG. 5a) for the emitter, collector, and base electrodes formed on the top, side, and bottom surfaces of the dielectric substrate 11 is in an overlapped relationship with each other when viewed in the direction normal to the substrate 11, and when the conductor layer sections have approximately the same widths and are so arranged as to face each other, with the ceramic substrate interposed therebetween. Conductor layers of the patterns shown in FIG. 5 (b) represent an unfavorable example as compared with those shown in FIG. 5 (a). In cases where conductor layers 52 and 52' on the top and bottom surfaces of a dielectric substrate 51 are so disposed as to produce some crossover portions, appreciable deterioration in electrical performance results.

The preferred embodiment of this invention will be explained in detail referring to FIG. 5 (a). The substrate 11 is made of a square alumina ceramic plate, 2 mm in width, 2 mm in length, and 1 mm in thickness. On the top surface of the substrate are formed metallization layers 21' (0.525 mm in width) for the emitter electrode with their middle portions protruding inward (0.2 mm in width and 0.2 mm in length), a strip-shaped metallization layer 22' (0.15 mm in width and 1.2 mm in total length) for the collector electrode, and another strip-shaped metallization layer 23' (0.15 mm in width and 0.6 mm in length) for the base electrode. On the bottom surface of the substrate 11 are formed metallization layers 21 (0.525 mm in width each) for the emitter electrodes and metallization layers 22 and 23 (0.15 mm in width and 0.6 mm in length) for the collector electrode and the base electrode. The layers 21', 22' and 23' and 21, 22 and 23 are electrically integrated respectively by those metallization layers formed on the side surface of the substrate 11. It is to be noted that the three lead wires should be brazed to the layers 21, 22, and 23 and that the semiconductor element be attached to the layer 22' for the collector electrode.

Referring now to FIG. 6, the $|S_{21}|^2$ vs frequency response characteristic curve 61 of a semiconductor device having the housing structure of FIG. 5 (a) is shown, wherein $S_{21}$ is the S parameter (reflection and transmission coefficients) in the direction (2, 1). This shows a distinct improvement over a similar characteristic curve for the devices of FIGS. 1 and 5 (b), whose corresponding curves are denoted by numerals 62 and 63 in FIG. 6. Similarly, FIG. 7 shows characteristic curves 71, 72 and 73 of maximum power gain (MPG) as a function of frequency for the semiconductor devices having structures as shown in FIG. 5 (a), FIG. 5 (b), and FIG. 1, respectively. As will be apparent from these curves of FIGS. 6 and 7, semiconductor devices according to this invention have a markedly improved high frequency characteristics. It will be also apparent to those skilled in the art that the present invention can find application not only in semiconductor devices, such as transistors or diodes, but also in integrated circuits. It will also be appreciated that modifications may be made to the embodiments of the invention herein specifically described without necessarily departing from the spirit and scope of the invention.

What is claimed is:

1. A packaged semiconductor device for use in the microwave frequency region, comprising a flat rectangular substrate of a dielectric material having substantially parallel top and bottom surfaces, first, second, third and fourth conductive layers formed on said substrate, a transistor element operable in the microwave frequency region, each of said layers having a first part formed on said top surface, a second part formed on said side surface, and a third part formed on said bottom surface, said first, second and third parts being electrically connected with each other, first, second and third parts of said first conductive layer extending along and over the entire length of one side of said substrate, the first, second, and third parts of said second conductive layer extending along and over the entire length of the opposite side of said substrate to said one side and in parallel with said first, second and third parts of said first conductive layer, respectively; the first, second and third parts of said third and fourth conductive layers being arranged respectively between said first, second and third parts of said first conductive layer and said first, second and third parts of said second conductive layer and extending in parallel with said first and second conductor layers, first parts of said third and fourth conductive layers being arranged in line, third parts of said third and fourth conductive layers being arranged in line, the first part of each conductive layer overlapping only with its own third part when viewed in a direction normal to said substrate; the collector of said transistor element being connected to said first part of said third conductive layer, the base of said transistor element being connected to said first part of said fourth conductive layer, and the emitter of said transistor element being connected to said first parts of said first and second conductive layers; and lead-out conductors respectively connected to said third parts of said first, second, third, and fourth conductive layers.

2. A semiconductor device as claimed in claim 1, wherein said dielectric substrate is made of ceramic material.

3. A semiconductor device as claimed in claim 1, wherein said dielectric substrate is made of alumina ceramic.

4. A semiconductor device as claimed in claim 1, wherein said lead-out wires are soldered onto said third parts, respectively, said solder adhering also to said second part, whereby each of the electrical paths from said first part to said lead-out wire has a bent portion between said second part and said lead-out wire forming an angle greater than 90° due to the soldering material.

5. A semiconductor device as claimed in claim 1, further comprising a wall member of ceramic material disposed on said top surface and said first parts of said conductor layers; and a covering member disposed on said wall member for hermetically sealing said semiconductor element.

6. A semiconductor device as claimed in claim 5, wherein said wall member is made of alumina.

* * * * *